United States Patent
Mirhaj et al.

(10) Patent No.: US 9,473,165 B2
(45) Date of Patent: Oct. 18, 2016

(54) REDUCING SIGNAL DEPENDENCE FOR CDAC REFERENCE VOLTAGE

(71) Applicant: QUALCOMM Incorporated, San Diego, CA (US)

(72) Inventors: Seyed Arash Mirhaj, Los Angeles, CA (US); Sameer Wadhwa, San Diego, CA (US); Dinesh Jagannath Alladi, San Diego, CA (US); Kentaro Yamamoto, San Diego, CA (US); Xiaoke Wen, San Diego, CA (US); Masoud Ensafdaran, San Diego, CA (US); Weihua Chen, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/465,650

(22) Filed: Aug. 21, 2014

(65) Prior Publication Data

US 2016/0056833 A1 Feb. 25, 2016

(51) Int. Cl.
  *H03M 1/66* (2006.01)
  *H03M 1/72* (2006.01)
  *H03M 1/80* (2006.01)
  *H03M 1/06* (2006.01)

(52) U.S. Cl.
  CPC .......... *H03M 1/72* (2013.01); *H03M 1/0612* (2013.01); *H03M 1/66* (2013.01); *H03M 1/804* (2013.01); *H03M 1/806* (2013.01)

(58) Field of Classification Search
  CPC ...... H03M 1/72; H03M 1/804; H03M 1/806; H03M 1/66; H03M 1/0612
  USPC .................................................. 341/150, 144
  See application file for complete search history.

(56) References Cited

U.S. PATENT DOCUMENTS

| | | | | |
|---|---|---|---|---|
| 5,084,634 A | * | 1/1992 | Gorecki | H03K 17/161 327/362 |
| 5,281,866 A | * | 1/1994 | Rundel | G05F 1/462 327/365 |
| 5,367,302 A | * | 11/1994 | Kalthoff | H03M 1/804 341/163 |
| 6,094,155 A | * | 7/2000 | Fees | H03M 1/0863 327/401 |
| 6,486,816 B2 | * | 11/2002 | Seymour | 341/150 |
| 6,747,589 B2 | * | 6/2004 | Srinivasan et al. | 341/172 |
| 6,870,496 B2 | | 3/2005 | Krymski | |
| 8,035,622 B2 | | 10/2011 | Hotelling et al. | |

(Continued)

OTHER PUBLICATIONS

Zhu Y., et al., "Split-SAR ADCs: Improved Linearity with Power and Speed Optimization," IEEE Transactions on Very Large Scale Integration (VLSI) Systems, Feb. 2014, vol. 22 (2), pp. 372-383.

(Continued)

*Primary Examiner* — Brian Young
(74) *Attorney, Agent, or Firm* — Procopio, Cory, Hargreaves & Savitch LLP

(57) ABSTRACT

Reducing signal dependence for a reference voltage of a CDAC includes: splitting a decoupling capacitor into a plurality of capacitors smaller in size than a size of the decoupling capacitor; isolating at least one of the plurality of capacitors from a sampling buffer coupled to the reference voltage during a conversion phase; and supplying an appropriate amount of charge needed to replenish charge drawn by capacitors in the CDAC at each conversion step using a charge pump to pump in a dummy charge to the CDAC so that resulting configurations of the CDAC draw substantially similar amount of charge for each code change of the each conversion step.

12 Claims, 5 Drawing Sheets

(56) References Cited

U.S. PATENT DOCUMENTS 8,223,044 B2 7/2012 Snedeker
2013/0249727 A1 9/2013 Hurrell
2014/0062752 A1 3/2014 Gou et al.

OTHER PUBLICATIONS

International Search Report and Written Opinion—PCT/US2015/046161—ISA/EPO—Nov. 10, 2015.

* cited by examiner

REDUCING SIGNAL DEPENDENCE FOR CDAC REFERENCE VOLTAGE

BACKGROUND

1. Field

This invention relates to a reference voltage, and more specifically, to reducing signal dependence for the reference voltage.

2. Background

In a successive approximation register analog-to-digital converter (SAR-ADC), the reference voltage should be stable during the conversion cycle. Moreover, if the digital-to-analog converter (DAC) inside the ADC is capacitive (i.e., CDAC), some charge needs to be drawn from the reference voltage to the CDAC at every voltage change during the conversion cycle of the ADC. In one conventional solution, the size of the decoupling capacitor is increased such that the output impedance of the reference voltage source stays low enough to keep the reference voltage constant even with a large amount of charge that is needed for the DAC in a short period of time. However, this results in a very large area overhead.

FIG. 1 is a graph 100 showing the reference voltage versus the conversion step of a conventional CDAC. In this figure, the input is sampled at step 1 (110), a most-significant bit (MSB) decision is made at step 2 (112), an MSB-1 decision is made at step 3 (114), and other successive decisions are made in steps 4 through 11 (120), with a least-significant bit (LSB) decision being made at step 11 for a 10-bit ADC. As shown in FIG. 1, the reference voltage drops for the MSB conversion steps rather than staying constant due to discharging of the finite capacitor. At MSB steps, the voltage change needed on the CDAC is the largest and the total capacitance in the CDAC (that is being switched) is also the largest. Consequently, the charge drawn from the decoupling capacitor is so high that the voltage across the capacitor drops (see steps 2-5 in FIG. 1). Although the buffer tries to provide some charge to the decoupling capacitor, the total charge provided by the buffer cannot compensate for the charge drawn by the CDAC, since its bandwidth is limited and the conversion steps are very short in time. If the drop in reference voltage is decision independent (for instance, at the first MSB conversion), it translates to a differential nonlinearity (DNL) in the ADC characteristic curve.

After about steps 5-6, it can be seen that the drops due to the switching CDAC are much smaller and the buffer provides some excess charge to the decoupling capacitor, which results in a climb or slow increase in the reference voltage. This climb translates to a non-linearity in LSB conversions. The size of the non-linearity in LSBs depends on the slope of the climb and the number of appearances on the characteristic depends on an LSB that causes the slope to be the steepest.

After the second MSB decision (i.e., step 3 in FIG. 1), the drops are not equal for different cases. For example, if the comparator decision until step 3 is 00, then the drop in the reference voltage for step 3 is less than the case for 01. These code/input dependent drops in the reference voltage can result in an integral nonlinearity (INL) in the characteristic of the ADC.

SUMMARY

The present invention provides for reducing signal dependence for a CDAC reference voltage, which reduces the size of the voltage reference decoupling capacitor.

In one embodiment, a method for reducing signal dependence for a reference voltage of a CDAC is disclosed. The method includes: splitting a decoupling capacitor into a plurality of capacitors smaller in size than a size of the decoupling capacitor; isolating at least one of the plurality of capacitors from a sampling buffer coupled to the reference voltage during a conversion phase; and supplying an appropriate amount of charge needed to replenish charge drawn by capacitors in the CDAC at each conversion step using a charge pump to pump in a dummy charge to the CDAC so that resulting configurations of the CDAC draw substantially similar amount of charge for each code change of the each conversion step.

In another embodiment, an apparatus for reducing signal dependence for a reference voltage of a CDAC is disclosed. The apparatus includes: means for providing a decoupling capacitor function with a plurality of capacitors; means for isolating at least one of the plurality of capacitors from a sampling buffer coupled to the reference voltage during a conversion phase; and means for supplying an appropriate amount of charge needed to replenish charge drawn by capacitors in the CDAC at each conversion step by pumping a dummy charge into the CDAC so that resulting configurations of the CDAC draw substantially similar amount of charge for each code change of the each conversion step.

In yet another embodiment, a circuit to reduce signal dependence for a reference voltage of a CDAC is disclosed. The circuit includes: a plurality of capacitor configured to provide a decoupling capacitor function; an isolation switch configured to isolate at least one of the plurality of capacitors from a sampling buffer coupled to the reference voltage during a conversion phase; and a charge pump configured to supply an appropriate amount of charge needed to replenish charge drawn by capacitors in the CDAC at each conversion step by pumping a dummy charge into the CDAC so that resulting configurations of the CDAC draw substantially similar amount of charge for each code change of the each conversion step.

Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

As described above, the reference voltage fluctuates during the conversion cycle of a capacitive digital-to-analog converter (CDAC). For example, the reference voltage drops for the MSB conversion steps due to the discharging of the finite capacitor. However, towards the LSB conversion steps, the reference voltage slowly increases because the buffer provides excess charge to the decoupling capacitor.

Certain embodiments as described herein provide for reducing signal dependence for a CDAC reference voltage, which reduces the size of the voltage reference decoupling capacitor. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

Figure 2:
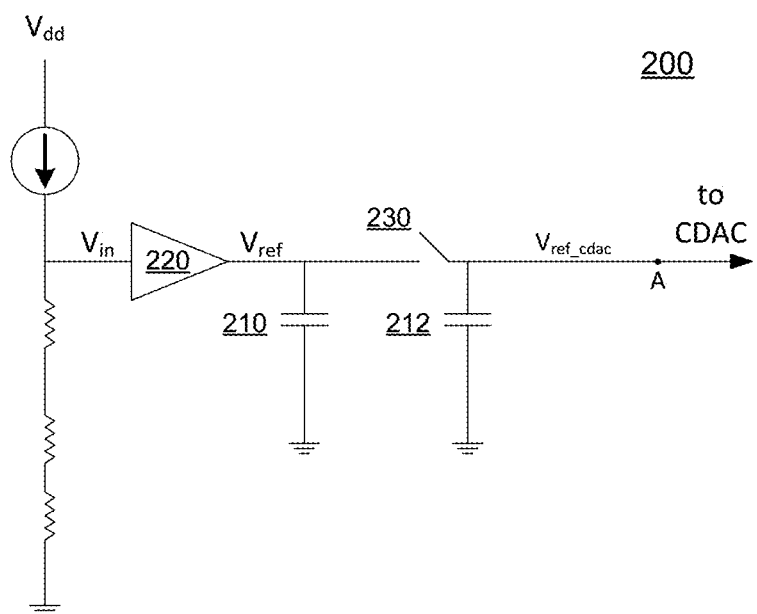
FIG. 2 is a schematic diagram of a circuit configured to address the steady climb in the reference voltage towards the LSB conversion steps in accordance with one embodiment of the present invention.

FIG. 2 is a schematic diagram of a circuit 200 configured to address the climb in the reference voltage towards the LSB conversion steps in accordance with one embodiment of the present invention. In the illustrated embodiment of FIG. 2, a decoupling capacitor between a reference buffer and the CDAC is split into two capacitors of smaller sizes. In one embodiment, the two smaller capacitors are approximately equal in size (i.e., 50-50 in proportion). In another embodiment, the decoupling capacitor is split into two capacitors of different sizes, for example, 70-30 in proportion. In another embodiment, the decoupling capacitor is split into multiple capacitors (i.e., more than two) of smaller sizes.

In the illustrated embodiment of FIG. 2, a decoupling capacitor is split into two capacitors 210, 212, and the capacitors are disconnected from the sampling buffer 220 during the conversion cycle using switch 230 to substantially reduce the integral nonlinearity (INL) due to the fluctuating reference voltage. The term INL refers to a maximum deviation between the ideal and the actual output levels of a DAC. The first decoupling capacitor 210 is connected to the reference buffer 220. The second decoupling capacitor 212 is connected to the CDAC side. The two decoupling capacitors 210, 212 are connected together only during the sampling phase of the ADC using an isolation switch 230 to allow the reference buffer 220 to charge and reset the decoupling capacitors 210, 212. During the conversion phase, switch 230 is turned off (i.e., the switch is open) to prevent the reference buffer 220 from pumping any charge into the reference voltage that is connected to the CDAC (which causes the climb in the reference voltage during the LSB decisions). Thus, having at least one decoupling capacitor 210 always connected to the reference buffer 220 enables the collection of the charging current from the reference buffer 220 during the conversion phase and the charging of the decoupling capacitors 210, 212 during the sampling phase. The capacitor 210 may also be used as a compensation capacitor for the buffer 220 for certain buffer architectures. In the alternative, the function of the isolation switch 230 can be provided by other means such as a field-effect transistor (FET).

Figure 1:
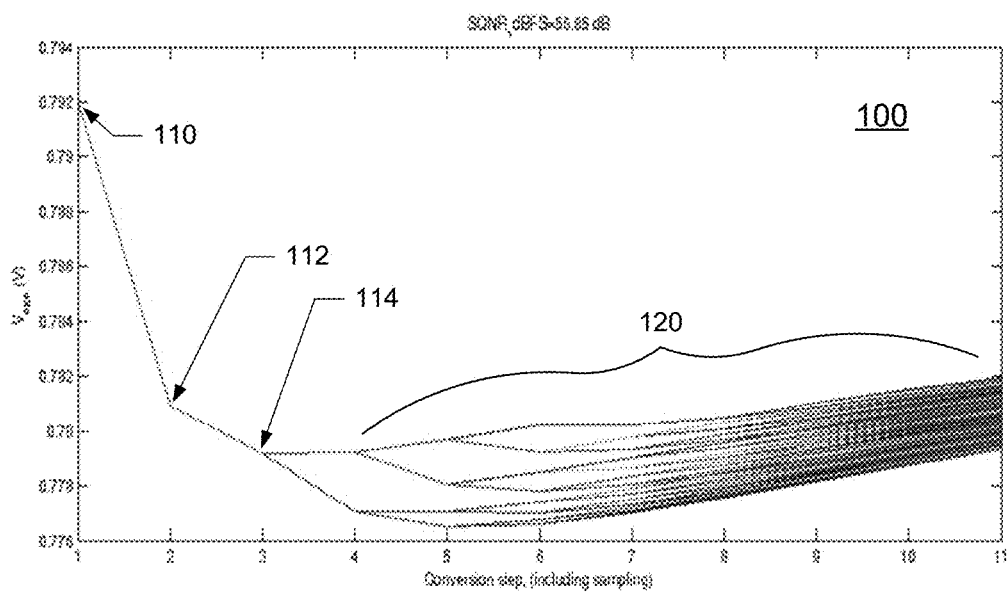
FIG. 1 is a graph showing the reference voltage versus the conversion step of a conventional CDAC.
Figure 3:
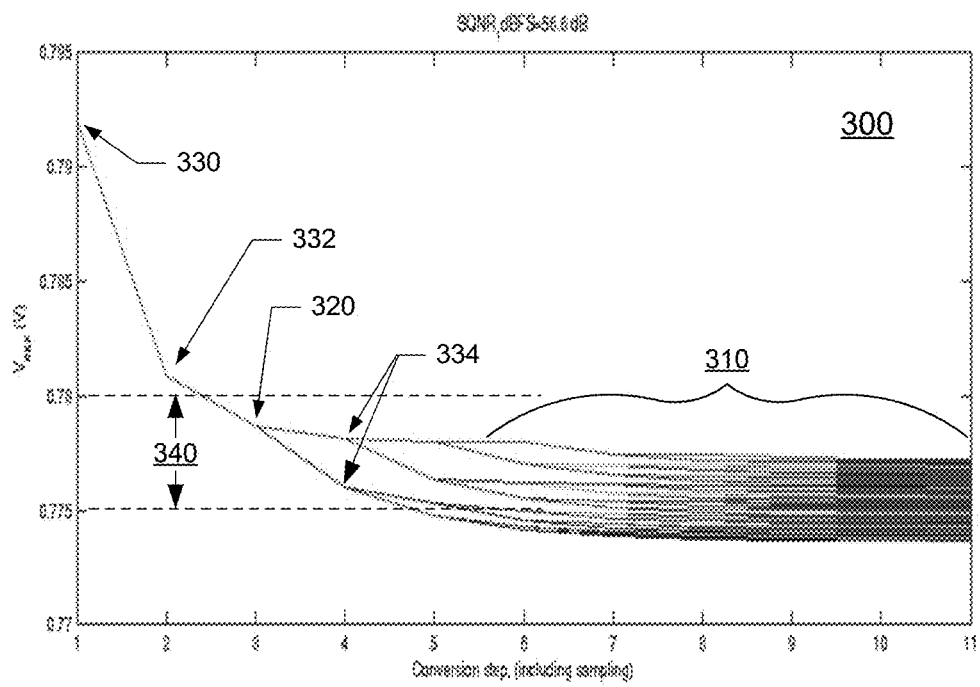
FIG. 3 is a graph showing the reference voltage versus the conversion step as a result of splitting the decoupling capacitor design and disconnecting/isolating the decoupling capacitor from the sampling buffer during the conversion cycle as described above and shown in FIG. 2.

FIG. 3 is a graph 300 showing the reference voltage versus the conversion step as a result of splitting the decoupling capacitor design and disconnecting/isolating the decoupling capacitor from the sampling buffer during the conversion cycle as described above and shown in FIG. 2. The graph 300 shows no climb (i.e., no steady increase) after about steps 5-6 (310) in the reference voltage, in contrast to the graph 100 shown in FIG. 1, which shows the steady increase 120.

Regarding the drops in the reference voltage during the MSB conversion steps due to the discharging of the finite capacitor, the drops occur after the second MSB decision (at around node 320). Moreover, as stated above, after about node 320, the drops in the reference voltage become code dependent and may cause INL in the ADC characteristic. Thus, these code dependent drops in the reference voltage can cause errors to propagate from one sample to the next sample.

Figure 4:
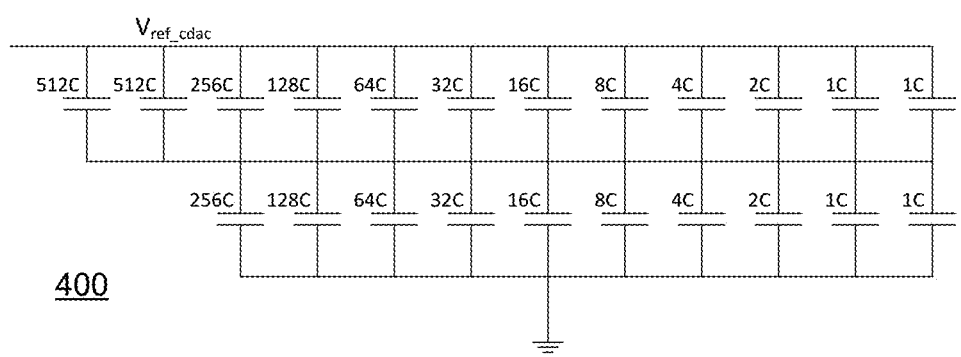
FIG. 4 illustrates a CDAC capacitor configuration assuming that at the end of step 3, the CDAC voltage is at ¾.

As an example of a code dependent drop with respect to FIG. 3, a 10-bit split capacitor CDAC is considered (see FIG. 4). At step 1 (e.g., node 330 in FIG. 3; i.e., the sampling phase), the input is sampled on all capacitors of the CDAC. At step 2 (e.g., node 332 in FIG. 3), one half of the capacitors is connected to the reference voltage ($V_{ref\_cdac}$) and the other half of the capacitors is connected to the ground to generate voltage ½. Thus, at this point, the charge drop from the reference voltage is independent of the input. However at step 3 (e.g., node 320 in FIG. 3), depending on the output of the comparator, the voltage of the CDAC may decrease to ¼ with the MSB capacitor switched to the ground, or may increase to ¾ with the MSB capacitor switched to $V_{ref\_cdac}$. In either case, the charge needed from the decoupling capacitor is the same (¼*512CV=128CV). FIG. 4 illustrates a CDAC capacitor configuration 400 assuming that at the end of step 3, the CDAC voltage is at ¾. Then, at step 4 (e.g., node 334 in FIG. 3), the CDAC configuration can change into one of two configurations.

Figure 5:
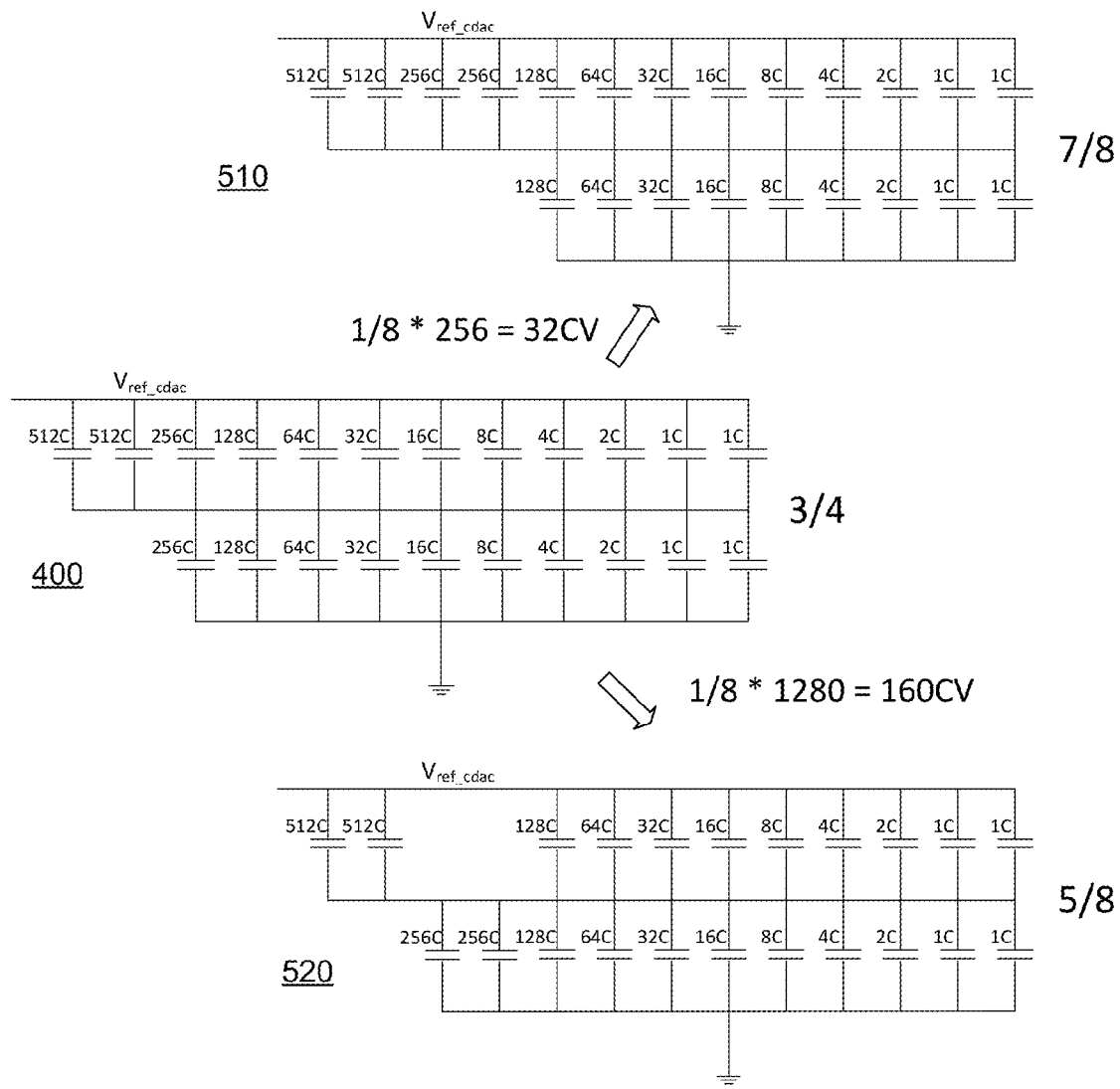
FIG. 5 illustrates the CDAC configuration which can change into a first configuration and a second configuration.

FIG. 5 illustrates the CDAC configuration 400 which can change into a first configuration 510 and a second configuration 520. In the illustrated embodiment of FIG. 5, the first configuration 510, in which the CDAC voltage increases to ⅞, needs ⅛*256=32CV units of charge from the decoupling capacitor. Further, the second configuration 520, in which the CDAC voltage decreases to ⅝, needs ⅛*1280=160CV units of charge from the decoupling capacitor. Accordingly, to make these two configurations draw the same amount of charge from the decoupling capacitor, the additional difference charge (160−32=128CV) is deliberately drawn from the reference buffer for the first configuration 510 by switching auxiliary capacitors which are separate from the main CDAC configuration, as shown in FIG. 6.

Figure 6:
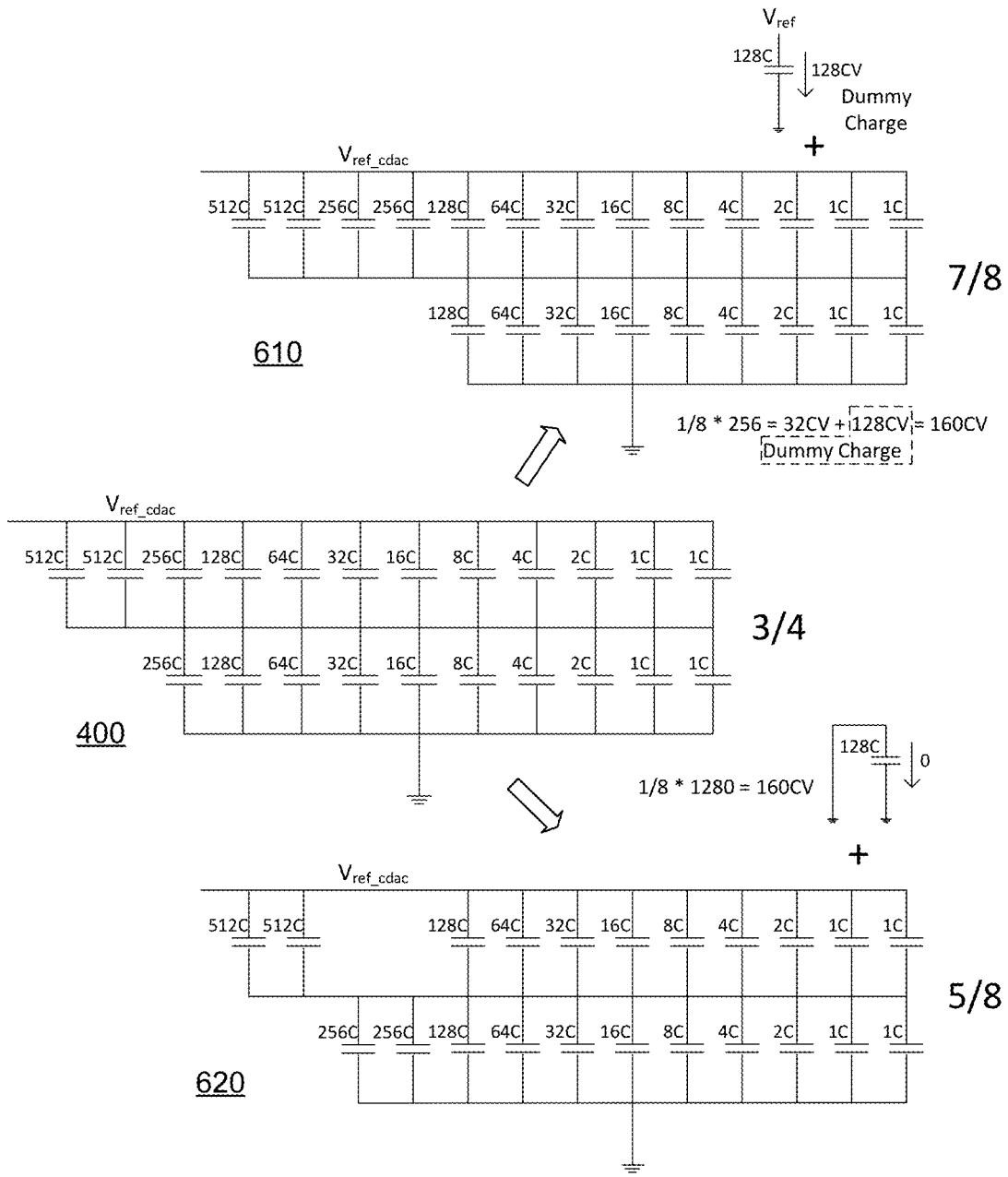
FIG. 6 illustrates the CDAC configuration which can change into a first configuration and a second configuration, but the changed configurations include dummy charges so that the first and the second configurations draw equal amount of charge for code changes.

FIG. 6 illustrates the CDAC configuration 400 which can change into a first configuration 610 and a second configuration 620, but the changed configurations include dummy charges so that the first 610 and the second 620 configurations draw equal amount of charge for code changes. Thus, in the example of FIG. 6, by adding a dummy charge of 128CV for the first configuration 610, both configurations now draw equal amount of charge at 160CV. The concept of drawing equal amount of charge for the code changes can be extended from FIG. 6 for the next steps.

Figure 7:
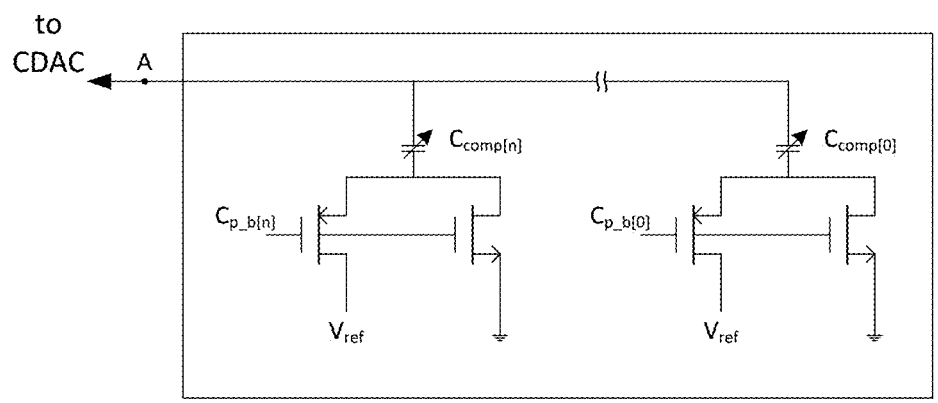
FIG. 7 is a schematic diagram of a charge pump including a plurality of compensation capacitors ($C_{comp[0]} \ldots C_{comp[n]}$) to supply charge to a CDAC.

Referring back to FIG. 2, during the conversion phase, switch 230 is open. Thus, depending on the decision made at each conversion step in the CDAC, the charges to be drawn from the reference voltage by the switching capacitors in the CDAC need to be replenished by the second decoupling capacitor 212. However, to keep the decoupling capacitors small, charges can be supplied by a charge pump including a plurality of compensation capacitors ($C_{comp[0]} \ldots C_{comp[n]}$) as shown in FIG. 7. Point A in FIG. 7 is common with point A in FIG. 2. Thus, the charge pump supplies an appropriate amount of charge needed to replenish the charge drawn by the capacitors at each conversion step. In the alternative, circuits other than the charge pump can be used to pump charge into the CDAC. For example, a current source controlled by a programmable pulse width can be used to inject a predetermined charge into the decoupling capacitor. The appropriate amount of charge needed to replenish the charge drawn by the capacitors at each conversion step was described above in the description with respect to FIGS. 5 through 7. Accordingly, the decoupling capacitors can be configured to be small.

Figure 8:
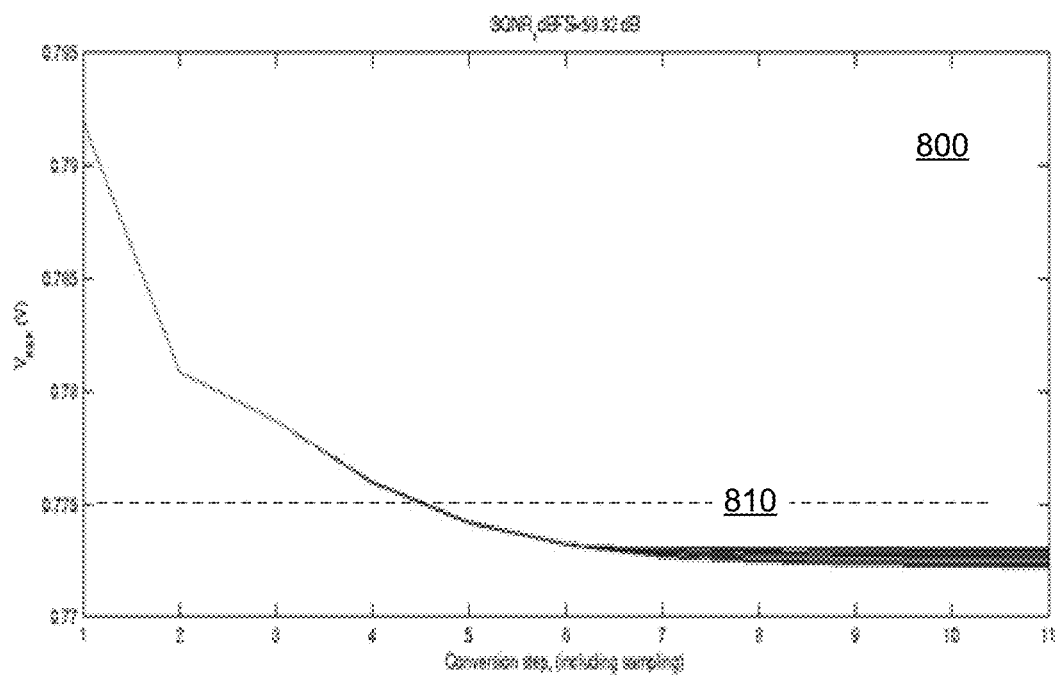
FIG. 8 is a graph showing the reference voltage versus the conversion step after compensating the differences in the drawn charges subsequent to the code change.

FIG. 8 is a graph 800 showing the reference voltage versus the conversion step after compensating the differences in the drawn charges subsequent to the code change. Although the drop in the reference voltage (drop below 0.775 V (810 in FIG. 8)) is more than the case shown in FIG. 3 (in which most of the drops are between 0.780 V and 0.775 V (340 in FIG. 3), since it is code/input independent, the drop does not cause nonlinearity. As can be seen in FIG. 8, after using the two techniques described above, the only non-ideality in the reference voltage is a large input-independent voltage drop in the first MSB steps. To reiterate, the two techniques described above include: (1) splitting the decoupling capacitor into two capacitors and disconnecting/isolating the decoupling capacitor from the sampling buffer during the conversion cycle; and (2) supplying an appropriate amount of charge needed to replenish the charge drawn by the capacitors at each conversion step using a charge pump to pump in a dummy charge of the difference between the resulting configuration with a highest voltage and the resulting configuration with a lowest voltage into the configuration with the lowest voltage resulting configuration. The appropriate amount of charge needed to replenish the charge drawn by the capacitors at each conversion step was described above in the description with respect to FIGS. 5 through 7. Further, using the two techniques, the decoupling capacitors can be configured to be small.

The large voltage drop in the first MSB steps means that the reference voltage in which the MSB comparisons have been done is different than the reference voltage at the end (LSB comparisons). Since the reference voltage at the end of the conversion is the actual reference of the ADC, this different value for the MSB comparisons translates to a temporary error in those decisions. For example, if the reference voltage at the second MSB decision (step 3 in FIG. 8) is larger than reference voltage at the end of the conversion, then instead of comparing with ¾ of the reference voltage at this point (i.e., step 3), the comparison is done with a voltage slightly higher than ¾. One solution is to pump some charge to the decoupling capacitor (using a charge pump as shown in FIG. 7) during the first couple of steps.

Although several embodiments of the invention are described above, many variations of the invention are possible. For example, although the illustrated embodiments show a charge pump supplying an appropriate amount of charge needed to replenish the charge drawn by the capacitors at each conversion step, any circuit with a bank of capacitors tied to a supply voltage with switching devices to select capacitors can be used. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A method for reducing signal dependence for a reference voltage of a CDAC, the method comprising:
    selectively isolating at least one of a plurality of capacitors including a first capacitor and a second capacitor from a sampling buffer coupled to the reference voltage,
    the plurality of capacitors represented as a decoupling capacitor,
    wherein selectively isolating at least one of a plurality of capacitors comprises coupling the first capacitor to the sampling buffer and isolating the second capacitor from the sampling buffer using an isolation switch during a conversion phase, wherein the isolation switch is open during the conversion phase to prevent the sampling buffer from pumping charge into the reference voltage of the CDAC.

2. The method of claim 1, wherein the size of each capacitor of the plurality of capacitors is substantially similar.

3. The method of claim 1, wherein the size of each capacitor of the plurality of capacitors is substantially different.

4. The method of claim 1, wherein the isolation switch is closed during a sampling phase to connect the first and second capacitors.

5. The method of claim 1, wherein a size of the charge pumped into the CDAC is equal to a difference between the resulting configuration with a highest voltage and the resulting configuration with a lowest voltage.

6. An apparatus for reducing signal dependence for a reference voltage of a CDAC, the apparatus comprising:

plural means for providing decoupling capacitor function;

means for selectively isolating at least one of the plural means for providing decoupling capacitor function including a first means for providing decoupling capacitor function and a second means for providing decoupling capacitor function from a sampling buffer coupled to the reference voltage, wherein the means for selectively isolating at least one of the plural means for providing decoupling capacitor function comprises means for isolating the second means for providing decoupling capacitor function from the sampling buffer which is deactivated during a sampling phase to connect the first and second means for providing decoupling capacitor function.

7. The apparatus of claim 6, wherein the size of each means for providing decoupling capacitor function of the plural means for providing decoupling capacitor function is substantially similar.

8. The apparatus of claim 6, wherein the means for isolating the second means for providing decoupling capacitor function is activated during the conversion phase to prevent the sampling buffer from pumping charge into the reference voltage of the CDAC.

9. A circuit to reduce signal dependence for a reference voltage of a CDAC, the circuit comprising:

a plurality of capacitors configured to provide a decoupling capacitor function, wherein the plurality of capacitors comprises a first capacitor and a second capacitor;

an isolation switch configured to isolate at least one of the plurality of capacitors from a sampling buffer coupled to the reference voltage during a conversion phase, wherein the isolation switch is open during the conversion phase to prevent the sampling buffer from pumping charge into the CDAC.

10. The circuit of claim 9, wherein the size of each capacitor of the plurality of capacitors is substantially similar.

11. The circuit of claim 9, wherein the isolation switch isolates the second capacitor from the sampling buffer.

12. The circuit of claim 9, wherein the isolation switch is closed during a sampling phase to connect the first and second capacitors.

* * * * *